United States Patent
Ito

(10) Patent No.: US 8,605,251 B2
(45) Date of Patent: Dec. 10, 2013

(54) LINEAR MOTOR, AND STAGE APPARATUS, EXPOSURE APPARATUS, AND METHOD FOR MANUFACTURING DEVICE USING THE SAME

(75) Inventor: Atsushi Ito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 652 days.

(21) Appl. No.: 12/749,954

(22) Filed: Mar. 30, 2010

(65) Prior Publication Data
US 2010/0253930 A1  Oct. 7, 2010

(30) Foreign Application Priority Data
Apr. 1, 2009 (JP) ................................. 2009-089180

(51) Int. Cl.
*G03B 27/42* (2006.01)
(52) U.S. Cl.
USPC .............................................. 355/53; 355/72
(58) Field of Classification Search
USPC ..................................................... 355/53, 72
See application file for complete search history.

(56) References Cited

U.S. PATENT DOCUMENTS

2002/0140298 A1* 10/2002 Maruyama ...................... 310/54
2008/0218004 A1*  9/2008 Mukaide ......................... 310/12

FOREIGN PATENT DOCUMENTS

| JP | 10-323012 A | 12/1998 |
| JP | 2002-078314 A | 3/2002 |
| JP | 2002-291219 A | 10/2002 |
| JP | 2003-116261 A | 4/2003 |
| JP | 4088728 B2 | 5/2008 |
| JP | 2008-220020 A | 9/2008 |
| JP | 2009-027006 A | 2/2009 |
| WO | 00/03301 A2 | 1/2000 |

* cited by examiner

*Primary Examiner* — Hung Henry Nguyen
*Assistant Examiner* — Mesfin T Asfaw
(74) *Attorney, Agent, or Firm* — Canon U.S.A., Inc. IP Division

(57) ABSTRACT

A linear motor is provided with a first member including a magnet and a second member including a coil facing the magnet, which are moved relative to each other. The second member includes a thermal conduction member, a thermal insulation member, the coil, and a first cooling unit, which are disposed in this order from the magnet side, and a second cooling unit configured to cool the thermal conduction member being disposed outside an area in which the magnet and the coil face each other.

20 Claims, 13 Drawing Sheets

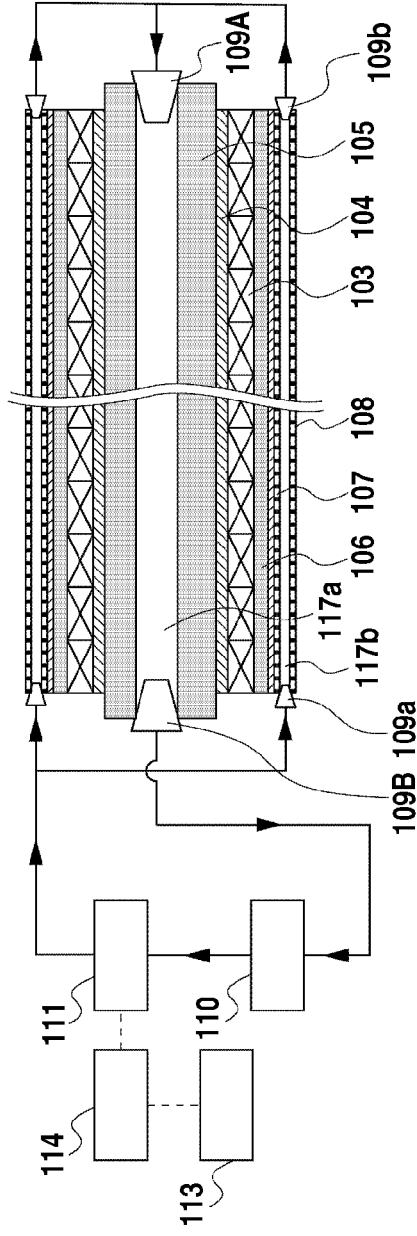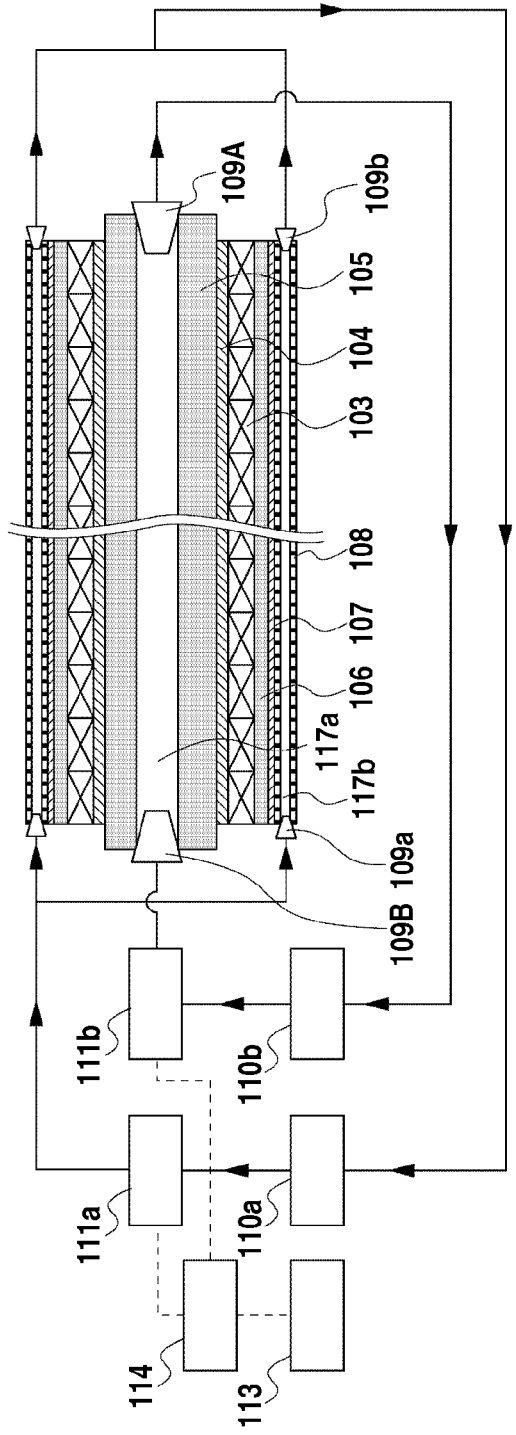

LINEAR MOTOR, AND STAGE APPARATUS, EXPOSURE APPARATUS, AND METHOD FOR MANUFACTURING DEVICE USING THE SAME

BACKGROUND OF THE INVENTION

1. Field of the Invention

The present invention relates to a linear motor, a stage apparatus having the linear motor, an exposure apparatus having the stage apparatus, and a method for manufacturing a device using the exposure apparatus.

2. Description of the Related Art

A semiconductor exposure apparatus used to manufacture, for example, a semiconductor device or a liquid crystal display (LCD) device includes a stage apparatus (a wafer stage and a reticle stage) for moving and positioning a wafer and a reticle at a high speed. As a method for driving the stage, a linear motor using Lorentz force is commonly used. Since the linear motor is used, a stage mover unit can be driven at a high speed in a non-contact state with respect to a stator unit, and positioning can be performed with high accuracy.

Recently, for improving the productivity (throughput) of the semiconductor exposure apparatus, stage acceleration is to be further increased. As a reticle or a substrate is increased in size, a mass of a stage is also increased. Therefore, driving force defined as "a mass of a movable body" X "acceleration" is greatly increased, and as a large electric current is applied to a linear motor coil for stage driving, the heat generation amount is increased.

If generated heat of the linear motor is leaked to an ambient space, a measurement error occurs caused by a temperature variation of a space of an optical axis of a laser interferometer, which is a position measurement sensor of a stage, or a measurement error occurs caused by thermal deformation of an optical component such as a reflective mirror disposed in an ambient space. Further, a structure or a lens around the linear motor is thermally deformed, thereby deteriorating the exposure transfer accuracy.

Japanese Patent No. 4088728 discusses a configuration in which a coil is housed in a vacuum chamber and generated heat of a coil is inhibited by vacuum thermal insulation from being leaked to an ambient space. A configuration in which a coolant flow passage is formed on a surface of the coil at a magnet side, and part of the heat amount leaked to an ambient space (magnet side) among entire heat amount generated when electric current is applied to the coil is collected by a coolant (see FIG. 11) is discussed.

Japanese Patent Application Laid-Open No. 10-323012 discusses a configuration in which a thermal insulation material is disposed between a coil of a linear motor and a permanent magnet (see FIG. 12). Heat generated when an electric current is applied to the coil is inhibited by the thermal insulation material from being leaked to an ambient space (a magnet side).

However, the configuration of vacuum thermal insulation discussed in Japanese Patent No. 4088728 uses a space for ensuring a thickness of a vacuum area, a thickness of a vacuum chamber cover, which can endure differential pressure between a vacuum and an atmospheric pressure, and a thickness of the vacuum area against deformation of the cover by differential pressure. Therefore, a large gap has to be ensured between the coil and the magnet.

In a configuration in which a coolant flow passage 99 is formed as illustrated in FIG. 11, most of the heat of the coil comes into a coolant of the coolant flow passage 99 through a thin sheet 82 disposed in contact with the coil 38. Since the heat amount that comes into the coolant is large, an appropriate coolant flow rate is used, so that a large space for the coolant flow passage 99 is also used.

Further, a cover thickness for preventing a cover 36 from being damaged by the coolant pressure and a space for accepting pressure deformation of the cover are used. Therefore, this configuration also uses a large gap between the coil and the magnet.

Therefore, in the configuration of Japanese Patent No. 4088728, since the gap (so-called magnet gap) between the coil and the magnet is large, the efficiency of the linear motor deteriorates. As a result, an electric current for generating sufficient trust force is increased, thereby increasing heat generation.

In the configuration of Japanese Patent Application Laid-Open No. 10-323012, as a value d/λ (herein referred to as "thermal resistivity R") obtained by dividing a thickness d (a unit is m) of the thermal insulation material by a thermal conductivity λ (a unit is W/mk) is increased, the heat amount leaked to the ambient space is decreased. In other words, as the thermal conductivity λ is decreased and the thickness d is increased, the heat amount leaked to the ambient space can be suppressed as much.

However, if the thickness of the thermal insulation material is large, the magnet gap is increased, so that the efficiency of the linear motor is lowered. As a result, the heat generation amount is increased.

It is beneficial to select a thermal insulation material with small thermal conductivity, to reduce the thickness of the thermal insulation material. However, the thermal conductivity of the thermal insulation material has a limit. Generally, a commercially available thermal insulation material (for example, rigid urethane) is $10^{-2}$ in thermal conductivity (a unit is W/mK), and a vacuum thermal insulation material (the inside of a packaging material vacuum to lower a thermal conductivity) is $10^{-3}$ in thermal conductivity.

If a thermal resistivity $R_0$ used to make the leakage heat amount equal to or less than a certain value, even though a thermal insulation material with a minimum available thermal conductivity $\lambda_{min}$ is used, a thickness $d_{min}$ ($=R_0 \times \lambda_{min}$) is to be used. A configuration of only the thermal insulation material is difficult to obtain a higher effect of suppressing the leakage heat amount at a thickness equal to or less than $d_{min}$. That is, a thickness of the thermal insulation material is determined by an available thermal conductivity of the thermal insulation material. Therefore, it is difficult to make the thickness of the thermal insulation material thin while suppressing the leakage heat amount.

SUMMARY OF THE INVENTION

According to an aspect of the present invention, a linear motor includes a first member including a magnet, and a second member including a coil facing the magnet and configured to move relative to the first member, wherein the second member includes a thermal conduction member, a thermal insulation member, the coil, and a first cooling unit which cools the coil, which are disposed in order from the magnet side, and the second member further includes a second cooling unit which cools the thermal conduction member, and the second cooling unit is disposed outside an area in which the magnet and the coil face each other.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 7A and 7B illustrate an example of a temperature adjusting circulation system of a coolant.

DESCRIPTION OF THE EMBODIMENTS

Various exemplary embodiments, features, and aspects of the invention will be described in detail below with reference to the drawings.

Figure 9:
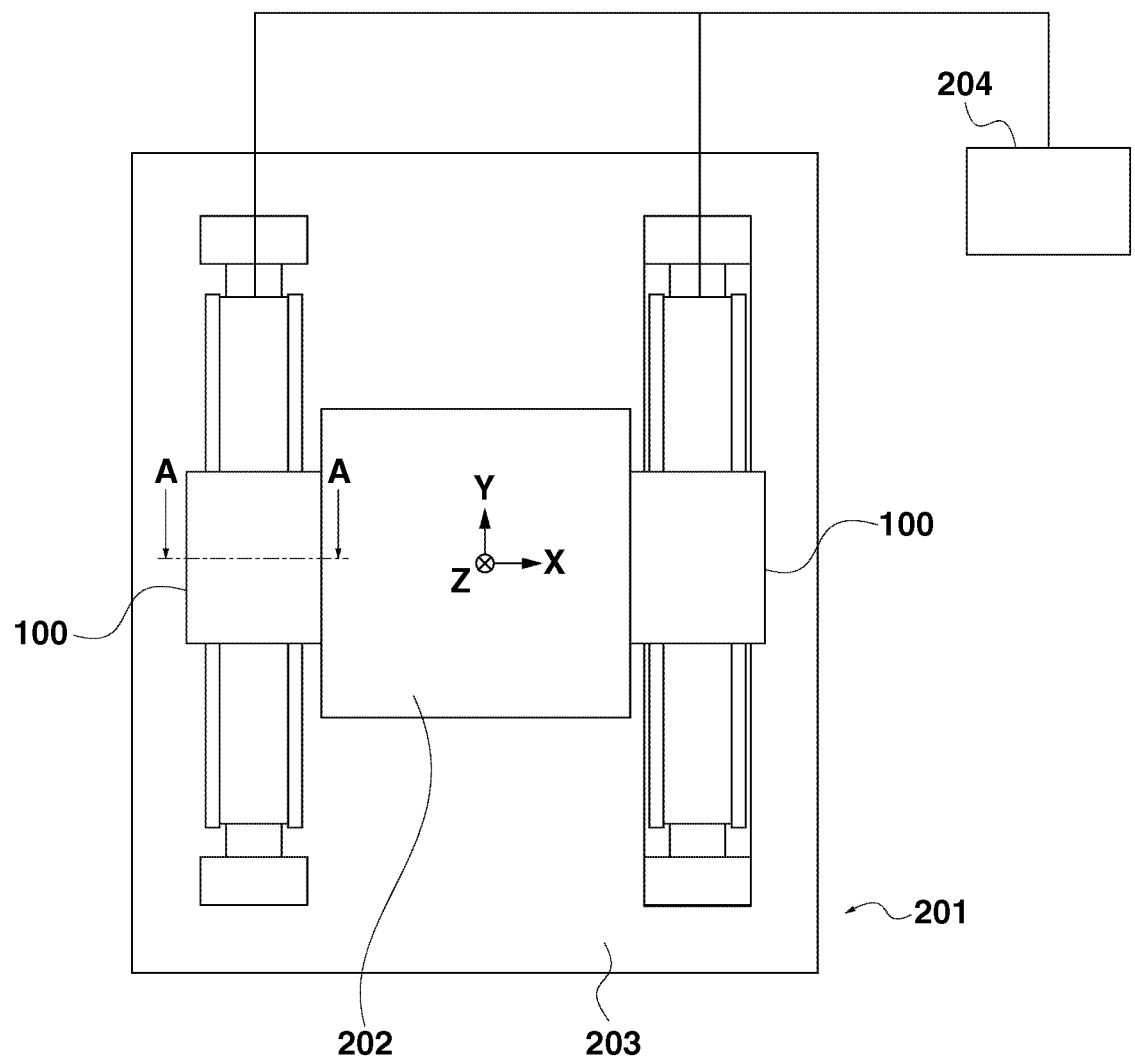
FIG. 9 illustrates an example of a stage apparatus according to the first exemplary embodiment.

FIG. 9 illustrates a stage apparatus 201. The stage apparatus 201 includes two linear motors 100 on a surface plate 203. A movable top plate 202 is coupled to the linear motors 100 and moves on the surface plate 203 in a Y axis direction. A hydrostatic bearing (not illustrated) is disposed between the movable top plate 202 and the surface plate 203. The movable top plate 202 is moved in the Y direction in a state in which the movable top plate 202 is guided in a non-contact manner in an X direction or a Z direction by the hydrostatic bearing.

The movable top plate 202 includes a mirror (not illustrated) on its side and position of the top plate 202 can be measured by a laser interferometer (not illustrated). When an electric current is applied to the linear motors 100 by a current driver 204, driving force is generated, and the movable top plate 202 can move in the Y direction of FIG. 9.

Figure 1:
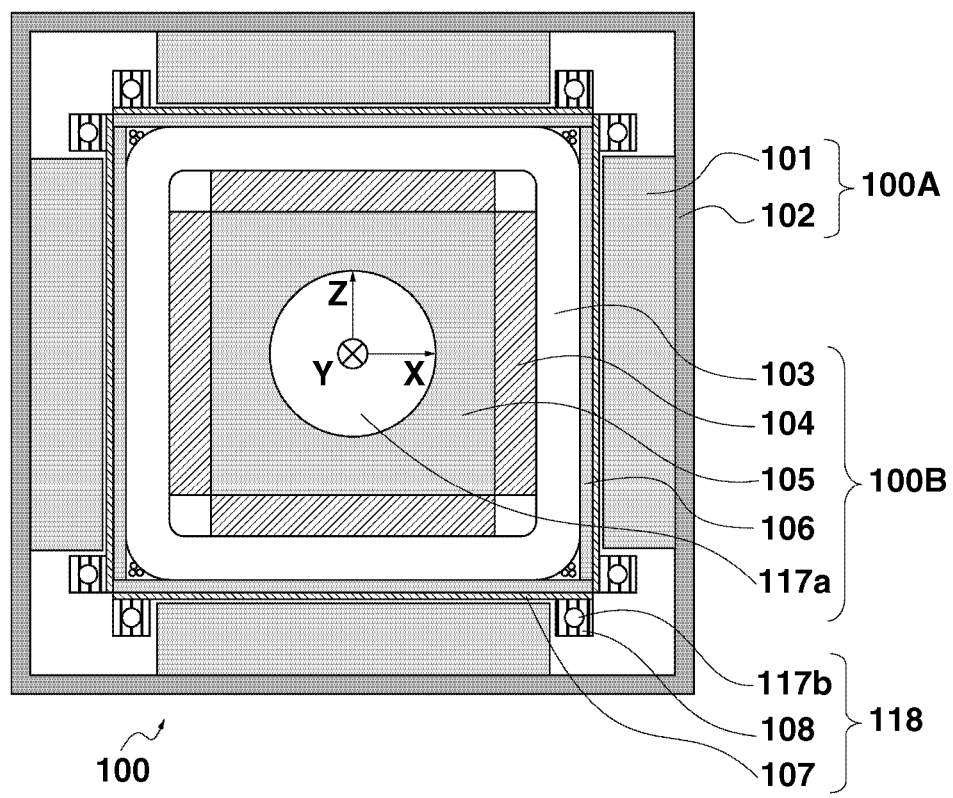
FIG. 1 is a cross-sectional view illustrating an example of a linear motor according to a first exemplary embodiment of the present invention.

FIG. 1 illustrates an example of a first exemplary embodiment of the present invention, and is a cross-sectional view of the linear motor 100 taken along line A-A in FIG. 9. The linear motor 100 mainly includes a mover 100A (first member) and a stator 100B (second member).

The stator 100B of the linear motor 100 includes a square cylindrical annular coil 103 of a substantially quadrangular shape, a yoke 104, and a first cooling unit 105 for cooling the coil 103. The substantially quadrangular shape represents a shape in which a cross-sectional shape includes four straight lines, for example, two straight lines are connected through a curved line as illustrated in FIG. 1.

In the present exemplary embodiment, the quadrangular shape is used, however, for example, a triangular shape, a hexagonal shape, or a circular shape may be used. In this case, the mover 100A may have a triangular shape, a hexagonal shape, or a circular shape, according to the shape of the stator 100B.

The first cooling unit 105 includes a coolant flow passage 117a for cooling the coil and is a structure disposed in a space inside the coil 103 to support the whole stator. One or more coolant flow passages 117a may be disposed. As the first cooling unit 105, a cooling system using thermal conduction or radiation other than a cooling system using thermal transfer with a coolant, and any cooling system may be used.

An insulation member (not illustrated) is disposed between the coil 103 and the yoke 104, to prevent the coil 103 and the yoke 104 from being electrically short-circuited.

The mover 100A of the linear motor 100 includes a plurality of permanent magnets 101 disposed to, respectively, face the plane portions of the coil that is parallel to a driving axis (Y axis in FIG. 1). The permanent magnets 101 are arranged in a so-called Halbach array in a direction (Y axis direction in FIG. 1) vertical to a sheet surface, and the permanent magnets 101 are connected by a housing 102.

When a magnetic field is generated by the permanent magnet 101 and the yoke 104, an electric current is applied from a current driver (not illustrated) to the coil 103. Driving force is generated, and the mover 100A is moved in the Y axis direction relative to the stator 100B. In the present exemplary embodiment, the mover is the first member, and the stator is the second member. However, since the first member and the second member only moves relatively, the stator may be the first member, and the mover may be the second member.

A stacked soft iron-based member, which is low in coercive force, such as a permalloy steel plate or a silicon steel plate is used as the yoke 104, to prevent an eddy current from being generated by relative movement of the permanent magnet 101.

In the linear motor 100, when an electric current is applied to the coil 103, the coil 103 generates heat. If the thermal resistance from the coil 103 to the coolant of the first cooling unit 105 is sufficiently smaller than the thermal resistance of the coil 103 and air in the ambient space of the coil 103, generated heat of the coil 103 is mostly collected by the coolant.

However, due to the low thermal conductivity of the coil 103 itself in the first cooling unit direction, and the high thermal resistance between the coil 103 and the yoke 104 and between the yoke 104 and the first cooling unit 105, it is difficult to sufficiently decrease the thermal resistance from the coil 103 to the coolant. As a result, generated heat of the coil 103 is not completely collected by the coolant of the first cooling unit 105 and is leaked to the ambient space side.

The ambient space of the coil 103 represents a space surrounding the coil 103, and, for example, in FIG. 1, the magnet 101 and the housing 102 are objects that are present in the ambient space.

A thermal insulation material 106 (thermal insulation member) is disposed between the coil 103 and the permanent magnet 101, and a thermal conduction member 107 is disposed between the thermal insulation material 106 and the permanent magnet 101. In the present exemplary embodiment, when the coil 103 has a square cylindrical shape, the thermal insulation material 106 and the thermal conduction member 107 are disposed on the plane portion of the coil 103 facing the magnet 101.

A cooling member 108 for cooling the thermal conduction member 107 is disposed outside an area in which the permanent magnet 101 faces the plane portion of the coil 103. The thermal conduction member 107 and the cooling member 108 configure a second cooling unit 118.

The thermal insulation material 106 may be made of a material with low thermal conductivity such as rigid urethane, glass wool, or a vacuum thermal insulation material. Generally, available rigid urethane is $10^{-2}$ in thermal conductivity (a unit is W/mK), and the vacuum thermal insulation material is $10^{-3}$ in thermal conductivity. The thermal conduction member 107 may be made of a material with high thermal conductivity such as cooper, carbon fiber, or carbon fiber-reinforced resin, and graphite. A high thermal conduction element, which uses a phase change of an operating fluid such as a heat pipe, may be used.

Since the cooling member 108 is disposed outside an area in which the magnet 101 and the coil 103 face each other, it is possible to reduce a gap between the coil 103 and the magnet 101, thereby improving the efficiency of the linear motor 100.

The cooling member 108 includes, for example, a coolant flow passage 117b there inside. The cooling member 108 and the thermal conduction member 107 may be adhered to each other by an adhesive but are coupled by means of welding to reduce the thermal resistance. The cooling member 108 and the thermal conduction member 107 may be integrally formed.

Since the thermal insulation material 106 is disposed on a surface of the coil 103 as in the above configuration, the thermal resistance from the coil 103 to the ambient space side is increased, and most of heat generated from the coil 103 is led in a coolant direction of the first cooling unit 105. Therefore, the heat amount, which is reduced by the thermal insulation material 106 and directed to the ambient space side, is mostly collected by the second cooling unit 118 (in FIG. 1, passes through the thermal conduction member 107 and is collected by the coolant of the cooling member 108, which cools the thermal conduction member 107).

As described above, the heat amount leaked to the ambient space from the coil 103 is first greatly reduced by the thermal insulation material 106, and the heat amount, which has passed through the thermal insulation material 106 and is to be leaked, is collected by the second cooling unit. Therefore, it is possible to suppress the leakage heat amount.

Next, a configuration according to the exemplary embodiment of present invention is compared in leakage heat amount and a thickness with a conventional configuration, and benefits of the present configuration are described.

Figure 2:
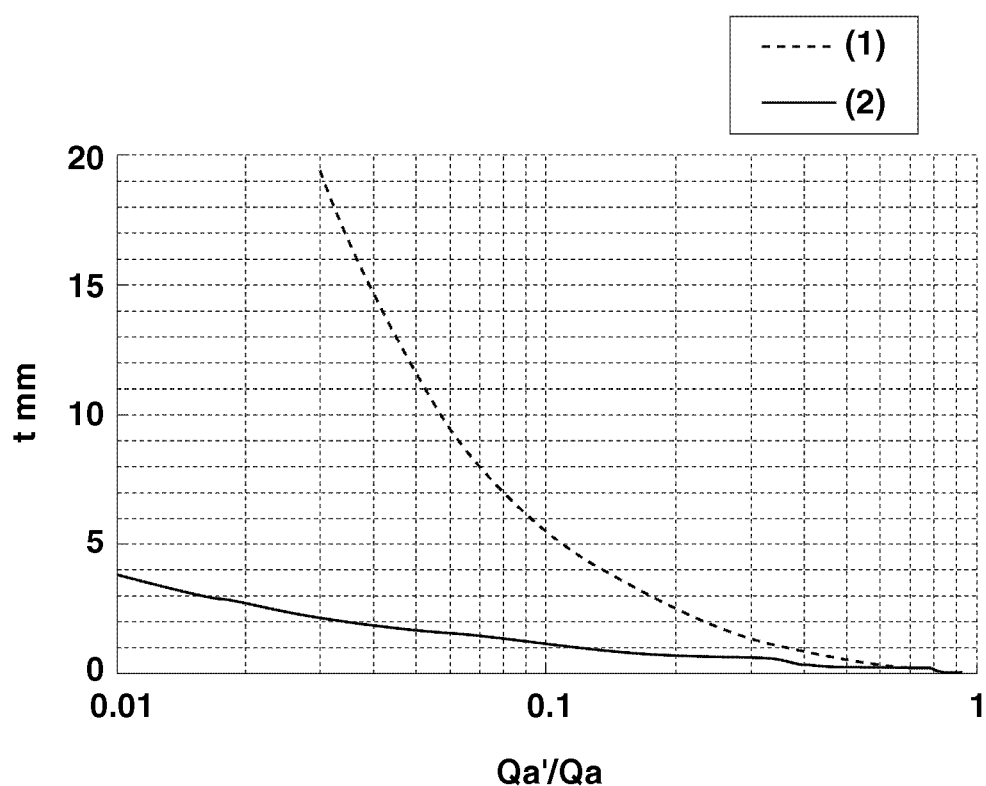
FIG. 2 illustrates a relationship example between a thickness and an effect of a leakage heat amount suppressing unit.

FIG. 2 is a graph illustrating a relationship between a leakage heat amount ratio (Qa'/Qa) and a total thickness t of a leakage heat amount suppressing unit (1) when only a thermal insulation material is disposed on a coil surface as a conventional configuration (indicated by a dotted line) and (2) when a thermal insulation material and a cooled thermal conduction member are disposed on a coil surface as a configuration of the present invention (indicated by a solid line).

The leakage heat amount ratio represents a ratio of a leakage heat mount Qa' when the conventional configuration or the configuration of the present invention is applied, to a leakage heat amount Qa when the coil is exposed. The total thickness t represents a thickness of a thermal insulation material in the conventional configuration and the sum of the thickness of the thermal insulation material and the thermal conduction member in the configuration of the present invention.

In a computation model, the coil of constant temperature is exposed to air (thermal conductivity of 10 W/m2K), and the leakage heat generation amount is computed (1) when the thermal insulation material is disposed between the coil and air and (2) when the thermal insulation material (which is the same in material as in (1)) and the thermal conduction member having a cooled end are disposed between the coil and air.

The thermal conductivity of the thermal insulation material was 0.006 W/mK corresponding to a vacuum thermal insulation material, and the thermal conductivity of the thermal conduction member was 380 W/mK corresponding to cooper. Air and an end of the thermal conduction member were the same in temperature. A graph curve, which represents the configuration (2) of the present invention, is obtained by computing an optimal value in which the sum of the thickness of the thermal material and the thermal conduction member is minimum when a certain leakage heat amount ratio (Qa'/Qa) is achieved.

In FIG. 2, for example, when the leakage heat amount ratio is about 0.1 (when the leakage heat amount is reduced to 0.1 times of that when the coil is exposed), the conventional configuration with only the thermal insulation material has a thickness of 5.4 mm, whereas the configuration of the present invention can achieve at a thickness of 1.1 mm. In the thickness of 1.1 mm, the thickness of the thermal insulation material is 0.6 mm, and the thickness of the thermal conduction member is 0.5 mm.

When the leakage heat amount ratio is equal to or less than 0.1 (the case of greatly reducing the leakage heat amount), a distance between the graph curves of the configuration of the present invention illustrated in FIG. 2 and the conventional configuration is greatly increased. Therefore, it can be understood that the configuration of the present invention has a large effect compared to the conventional configuration. The thermal conduction member is made of cooper in the above computation, but when a material with higher thermal conductivity is used, the effect is further increased, and the thermal conduction member can be formed thinner.

In the computation, when an assumptive parameter value (for example, thermal conductivity of air) becomes different, the leakage heat amount and the thickness value are changed. However, the fact that the configuration of the present invention having the thermal insulation material and the cooled thermal conduction member can achieve the leakage heat amount suppressing effect at the thinner thickness than the conventional configuration having only the thermal insulation material is not changed.

However, since the heat amount collected by the second cooling unit 118 is the heat amount that has passed through the thermal insulation material from the coil, the amount is very small. Therefore, even if a coolant flow passage 117c is disposed as the second cooling unit 118 as illustrated in FIG. 3, a thin thickness can be achieved.

Figure 3:
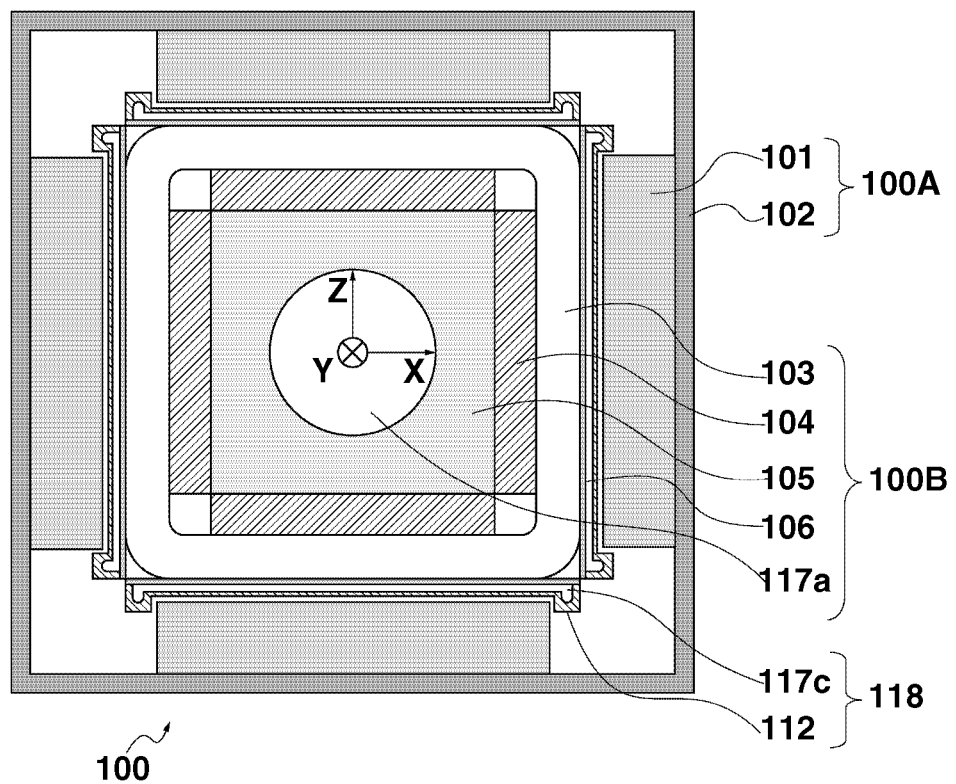
FIG. 3 is a cross-sectional view illustrating another example of a linear motor according to the first exemplary embodiment.

FIG. 3 illustrates a configuration in which a coolant flows through the coolant flow passage 117c disposed between the thermal insulation material 106 and the cover 112. Since the heat amount collected by the coolant of the coolant flow passage 117c is small, a low amount of the coolant flow may be used. Therefore, the large coolant pressure is not necessary, and therefore the cover 112 can be thinly configured. As a result, the efficiency of the linear motor can be improved.

Further, the thermal conductivity of the cover 112 does not need to be high, and it is possible to reduce a thickness and a deformation amount by using a material, which is high in Young's modulus and strength.

Figure 4:
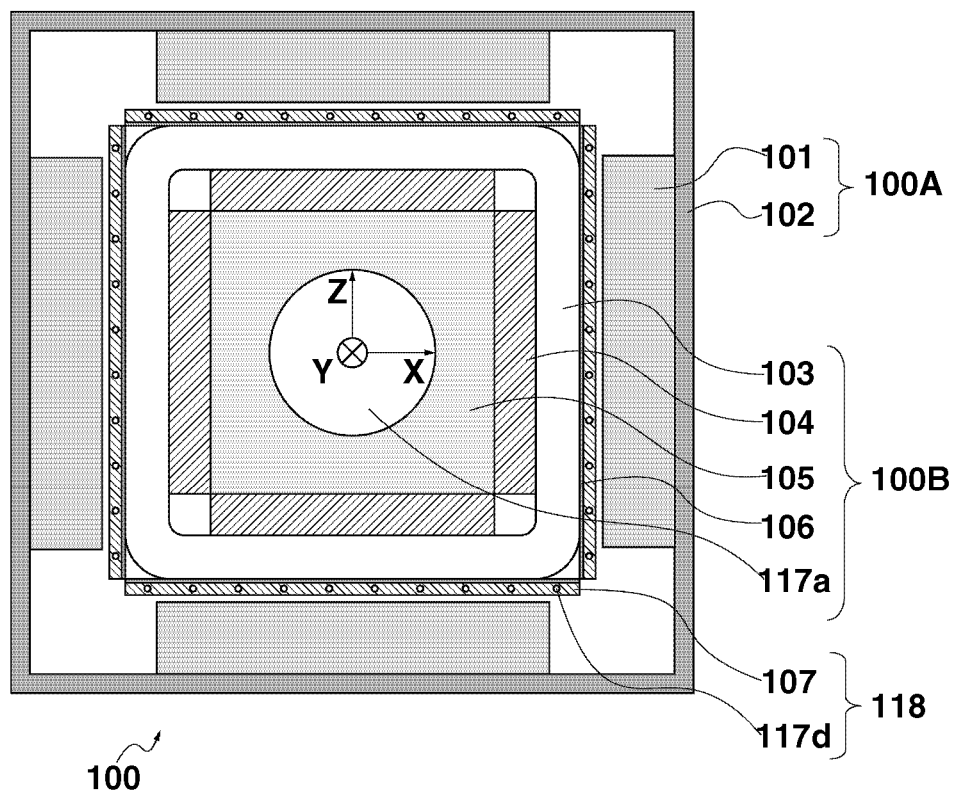
FIG. 4 is a cross-sectional view illustrating still another example of a linear motor according to the first exemplary embodiment.

Further, as illustrated in FIG. 4, the second cooling unit 118 may include the thermal conduction member 107 and a cooling unit (a coolant flow passage 117d), which is disposed inside the thermal conduction member 107 to cool the thermal conduction member 107. Since the heat amount collected by the coolant of the coolant flow passage 117c is small, a low amount of the coolant flow may be used. Since the small flow passage 117d is formed in the thermal conduction member 107 with a thin thickness and the coolant flows through the flow passage 117d, thereby it is possible to suppress the leakage heat amount.

Further, the thermal conduction member 107 in FIG. 4 is made of a material with high Young's modulus and strength, and thus it is possible to reduce a thickness and a deformation amount. Further, a material with high thermal conductivity may be used, and thereby a more heat amount can be collected by the coolant flow passage 117d.

Next, an auxiliary unit for suppressing the leakage heat amount will be described below. Hereinafter, for convenience, the configuration in FIG. 1 is described as a basic configuration, and it can be applied to configurations in FIGS. 3 and 4.

Figure 5A:
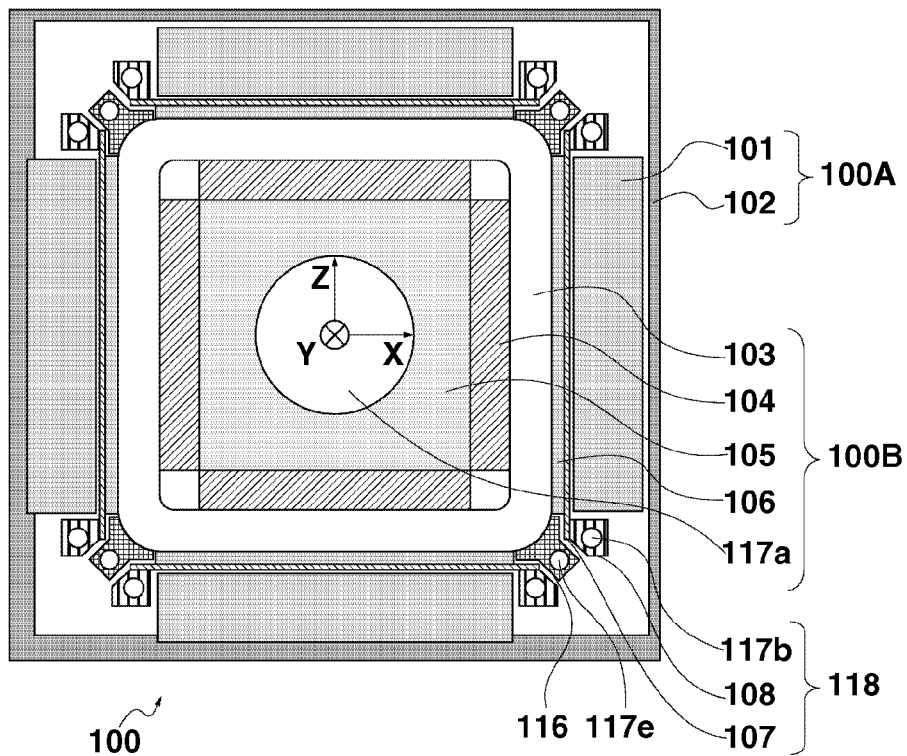
FIGS. 5A and 5B are cross-sectional views illustrating still another example of a linear motor according to the first exemplary embodiment.

FIG. 5A illustrates a configuration having a third cooling unit 116, which cools the coil 103 in the outside of an area opposite to the magnet and on a side opposite to the permanent magnet 101. The third cooling unit 116 includes a cooling flow passage 117e for cooling the coil 103 therein and may be coupled to the curved surface portion of the coil by, for example, an adhesive.

Since a cooling path for cooling the coil is increased by a portion in which the third cooling unit 116 is disposed, a ratio of the heat amount directed to the thermal material side can be reduced. Therefore, since it is possible to make the leakage heat amount smaller than in the configuration of FIG. 1, it is possible to make the thermal insulation material and the thermal conduction member thinner.

Figure 5B:
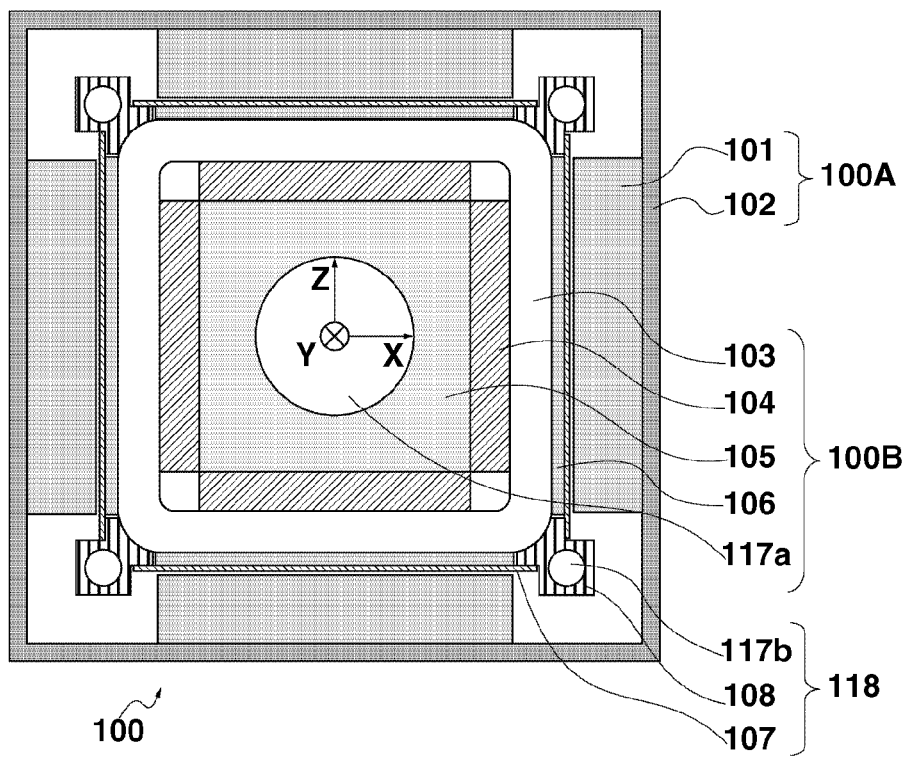

FIG. 5B illustrates a configuration in which the cooling member 108, which cools the thermal conduction member 107, also serves as the third cooling unit, which cools the coil 103. If a space of an area which does not face the magnet 101 at a magnet facing surface side of the coil 103 is limited, the cooling unit, which cools the thermal conduction member 107, also serves as the third cooling unit, which cools the coil, and thus the space can be efficiently used.

Further, since the third cooling unit is attached directly to the coil that generates heat, if the coolant flow amount is not set to be sufficiently large, the temperature of the coolant is increased, so that it is difficult to collect the heat. Even when the cooling member 108 also serves as the third cooling unit, if the temperature of the coolant is greatly increased by the collecting heat amount from the coil, the collecting heat amount by the thermal conduction member is reduced. Therefore, the sufficient coolant flow amount is to be set.

Figure 6A:
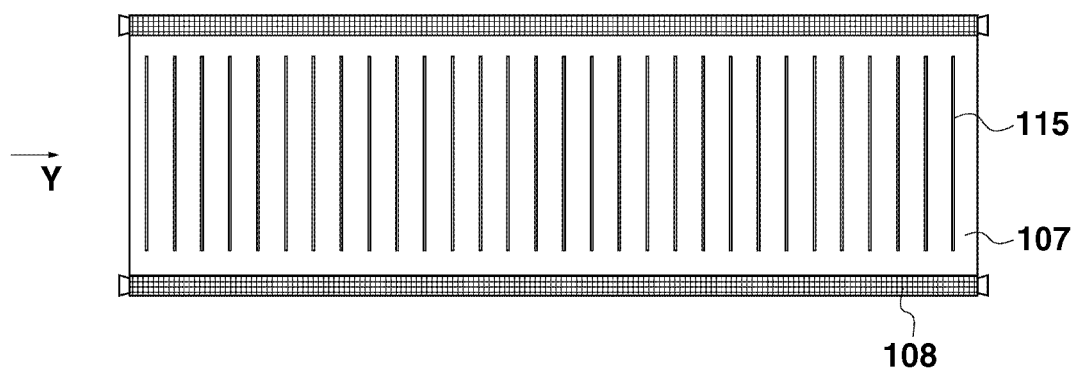
FIGS. 6A and 6B illustrate an example of a slit or dividing method of a thermal conduction member.

Next, another auxiliary unit for suppressing the leakage heat amount will be described below. As illustrated in FIG. 6, the thermal conduction member 107 may have a slit 115, which is formed in a direction facing the cooling member 108 that cools the thermal conduction member, or a divided structure. FIG. 6A illustrates a slit and FIG. 6B illustrates a divided structure.

When the thermal conduction member 108 is made of a conductive material, if the permanent magnet 101 and the coil 103 move relative to each other in the Y direction in FIG. 5, an eddy current is generated on a surface of the thermal conduction member 108. The generated eddy current serves as a relative movement resistance force, and there is a possibility that heat generation of the thermal conduction member 108 will be further increased. If the amount of the electric current supplied to the coil is increased to generate force for compensating the relative movement resistance force through the linear motor, the heat amount of the coil is further increased. Therefore, there is a possibility in which the leakage heat amount will be increased.

Figure 6B:
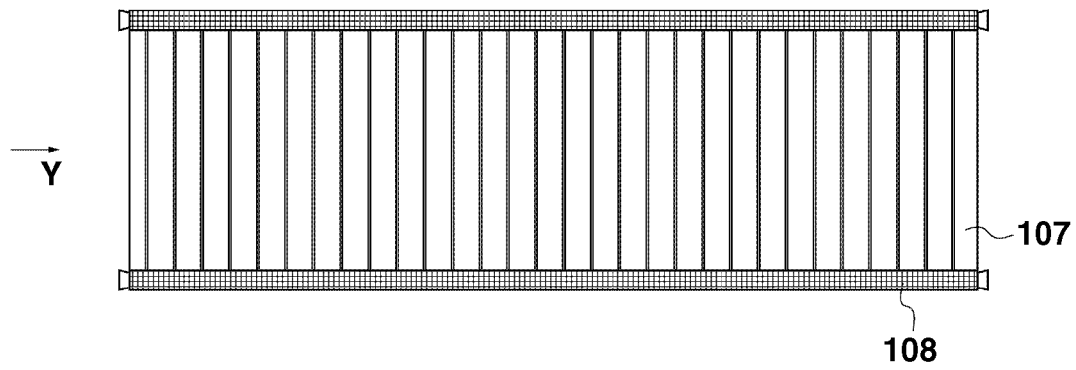

For this reason, as illustrated in FIGS. 6A and 6B, the slit or the divided structure is formed in the thermal conduction member 107. Therefore, even though a conductive material such as copper is used, it is possible to suppress the eddy current.

Further, since the purpose of the thermal conduction member 107 is to transport heat to the cooling member 108 side, a direction of the slit 115 or a divided direction is to be set to a direction toward the cooling member 108. When the slit or the divided structure is formed in the Y direction in FIG. 5, a part of the thermal conduction member 107 is thermally insulated from the cooling member 108, and thus an effect of collecting the leakage heat amount is not obtained or reduced.

Next, another auxiliary unit for suppressing the leakage heat amount will be described.

FIG. 7A illustrates an example of a coolant circulation system of a linear motor according to the present configuration. A temperature of a coolant transmitted from a pump 110 is adjusted by a temperature adjustor 111, and the coolant is supplied to an inlet coupling 109a of the cooling member 108, which cools the thermal conduction member 107.

The coolant that is output from an outlet coupling 109b through the coolant flow passage 117b is led to an inlet coupling 109A of the first cooling unit 105 that cools the coil 103. The coolant that is output from an inlet coupling 109B through the first cooling unit 105 enters the pump 110 again and is transmitted again. As described above, a circulation system, which circulates the coolant, is configured.

Figure 8A:
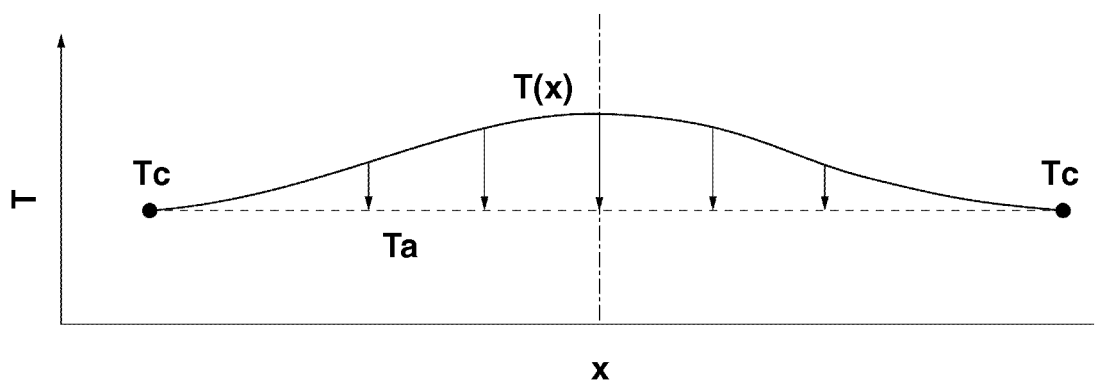
FIGS. 8A and 8B illustrate a temperature distribution of a thermal conduction member.
Figure 8B:
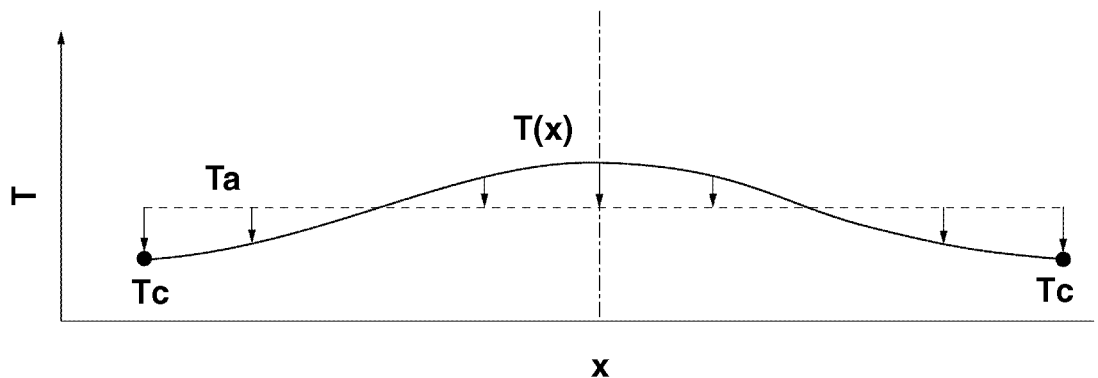

FIGS. 8A and 8B illustrate an example of a temperature distribution of an X direction or a Z direction of the thermal conduction member 107 in FIG. 1. The heat amount that has passed through the thermal insulation material 106 is heat-input to the thermal conduction member 107 and is collected by the coolant of the cooling member 108 through the thermal conduction member 107. A temperature distribution of the thermal conduction member 107 is as illustrated in FIGS. 8A and 8B if the heat amount that has passed through the thermal insulation material 106 and that is heat-input is almost the same at each position (x) of the thermal conduction member 107. The temperature at a center which is a farthest position from the cooling members 108 located at both ends thereof is highest, and the temperatures at both ends thereof, which are positions of the cooling members 108, become almost the same as a coolant temperature of the cooling member.

When a coolant temperature Tc of the cooling member 108, which cools the thermal conduction member 107, is set to be the same as a temperature Ta of air of the ambient space, a temperature T of the thermal conduction member 107 is higher than the ambient air temperature Tc as illustrated in FIG. 8A, and an heat amount is leaked from the thermal conduction member 107 to the ambient air.

When the coolant temperature Tc of the cooling member 108, which cools the thermal conduction member 107, is set to be lower than the ambient air temperature Ta, the temperature T of the thermal conduction member 107 is divided into a higher area and a lower area than the ambient air temperature Ta as illustrated in FIG. 8B. In this state, a part of the thermal conduction member 107 gives heat to the ambient air, and a part thereof collects heat from the ambient air.

If the heat amount given to the ambient air is larger, the leakage heat amount has a positive value, and it may cause heat expansion of a component in the ambient space. In contrast, if the heat amount taken from the ambient air is larger, the leakage heat amount has a negative value, and it may cause heat contraction of a component arranged in the ambient space.

If it is possible to set the coolant temperature Tc so that the heat amount given to the ambient air and the heat amount taken from the ambient air can be equal, an influence of the leakage heat amount to the ambient space can become zero. The ambient air temperature Ta can be known by disposing a thermometer at a certain position around the coil 103.

Incidentally, a maximum temperature of the thermal conduction member 107 when a design is arbitrarily made in the configuration illustrated in FIG. 1 is determined by the heat generation of the coil 103. When a large electric current is applied to the coil 103 and the heat amount is large, the temperature is high, whereas a small electric current is applied to the coil and the heat amount is small, the temperature is low. Therefore, to suppress the leakage heat amount, the coolant temperature Tc is appropriately adjusted in a driving state of the linear motor.

When the driving state is constant and is known in advance, the coolant temperature Tc is to be appropriately determined only once. When the driving state changes with time, as illustrated in FIGS. 7A and 7B, a measurement unit 113 for measuring the driving state of the linear motor and a computing unit 114 for calculating an appropriate coolant temperature based on the measurement result are disposed, and the coolant temperature may be determined by the temperature adjustor 111. As the measurement unit for measuring the driving state of the linear motor, for example, an ammeter for measuring the amount of an electric current applied to the coil or a voltmeter applied to the coil ends may be used.

FIG. 7A illustrates the coolant circulation system in which the coolant whose temperature is adjusted by the temperature adjustor 111 is first led to the cooling member 108 for cooling the thermal conduction member 107, and then flows through the first cooling unit 105. If the coolant first flows from the first cooling unit 105 in the reverse order, the collecting heat amount is large. Therefore, the temperature of the coolant is greatly increased, and it may be difficult to obtain a desired coolant temperature at a position of the cooling member 108 for cooling the thermal conduction member 107.

When the coolant, which flows in the first cooling unit 105, and the cooling member 108, which cools the thermal conduction member 107, is configured through one coolant flow passage as illustrated in FIG. 7, the coolant may be configured through a route that flows from the cooling member 108 for cooling the thermal conduction member 107.

FIG. 7B illustrates an example of a coolant circulation system in which the coolant flows individually in the first cooling unit 105 and the cooling member 108 for cooling the thermal conduction member 107. A coolant circulation system, which includes individual pumps 110a and 110b and temperature adjustors 111a and 111b, is provided. The coolant temperature adjustor 111a for the cooling member 108 that cools the thermal conduction member 107 may allow the coolant whose temperature is determined based on the driving state of the linear motor as described above to flow and suppress the leakage heat amount.

The coolant temperature adjustor 111b for the first cooling unit 105 may set the coolant temperature to be lower than the coolant temperature of the cooling member 108, which cools the thermal conduction member 107. Since the temperature of the coil 103 when the linear motor is driven is lowered by the degree in which the coolant temperature of the first cooling unit 105 is lowered, the heat amount leaked to the ambient space can be suppressed.

When the linear motor is not driven, the temperature of the coil is lower than the outside air temperature, and the coil collects heat from the ambient space. An appropriate coolant temperature may be determined by the measurement unit 113, which measures the linear motor driving state, and the coolant temperature computing unit 114.

As described above, according to the present exemplary embodiment, it is possible to suppress the amount of heat generated from the coil of the linear motor from being leaked to the ambient space. Therefore, for example, in FIG. 9, it is possible to suppress thermal deformation that is caused by a temperature variation of a structure such as the movable top plate 202 present in the space around the coil. Further, even though not illustrated in FIG. 9, since a temperature of an optical path of a laser interferometer present in the space around the coil does not easily vary, a measurement error of the interferometer can be reduced.

Further, since the thickness of the leakage heat amount suppressing unit can be reduced compared to the configuration with only the thermal insulation material, a gap between the coil and the magnet can be reduced, thereby improving the efficiency of the linear motor.

Next, another exemplary embodiment of the present invention will be described.

Figure 10:
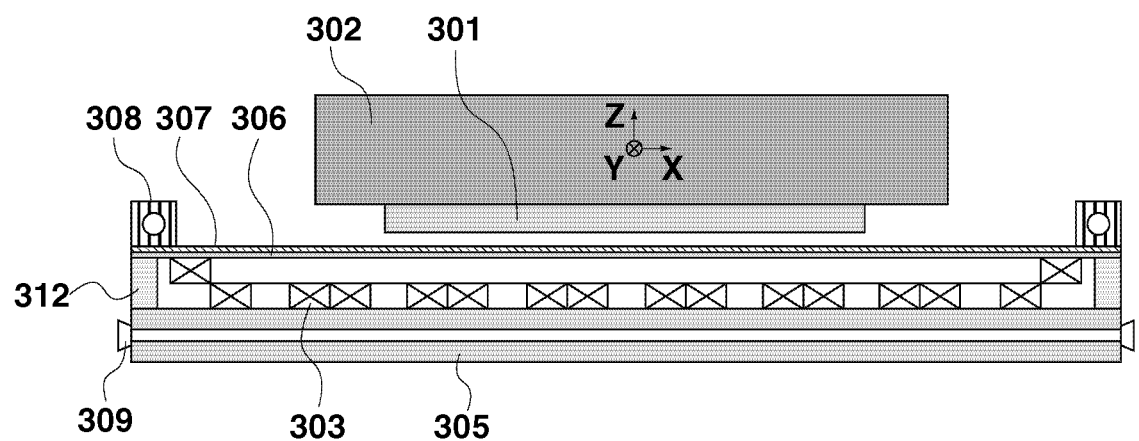
FIG. 10 illustrates an example of a stage apparatus according to a second exemplary embodiment of the present invention.
Figure 11A:
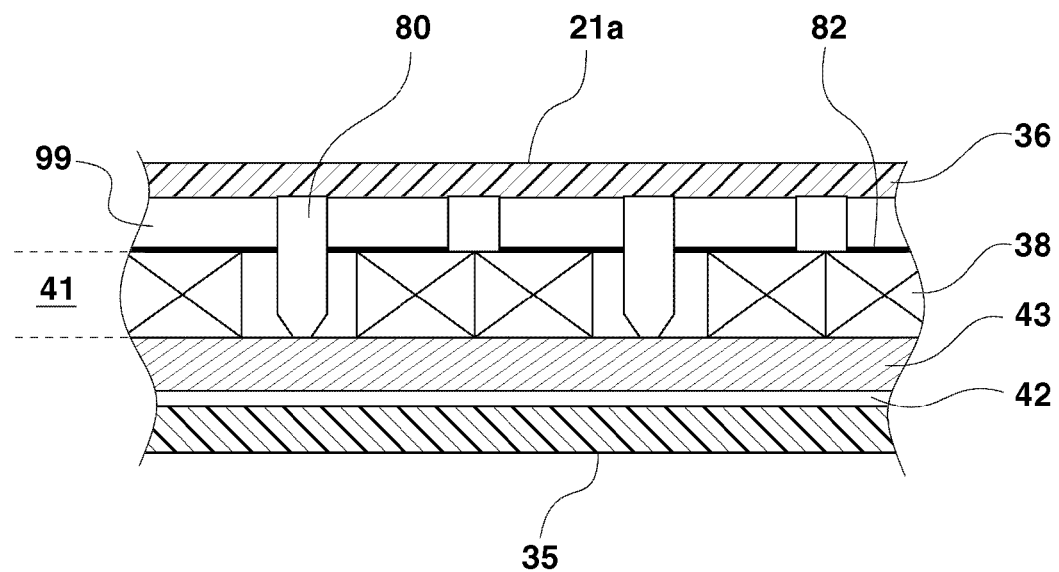
FIGS. 11A and 11B illustrate a conventional linear motor.
Figure 11B:
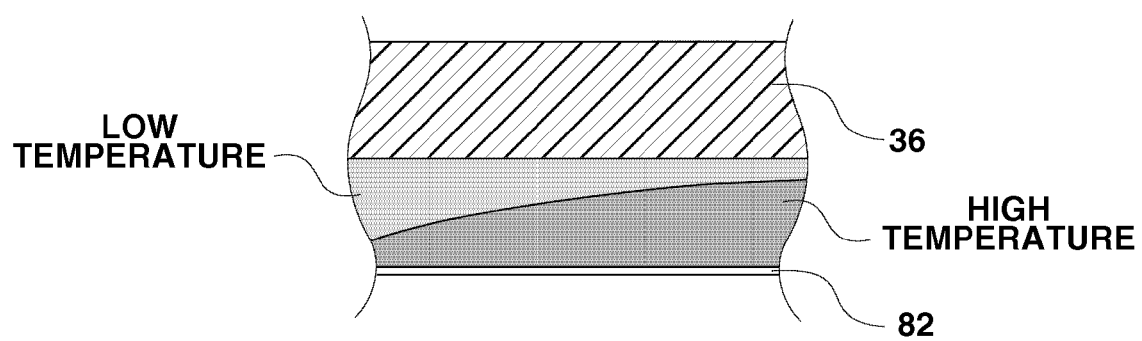
Figure 12A:
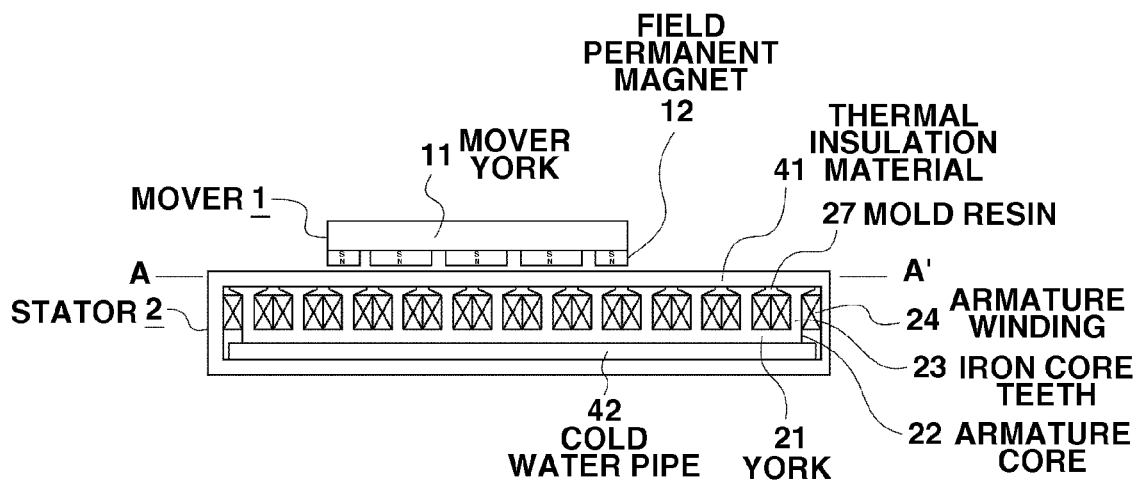
FIGS. 12A and 12B illustrate a conventional linear motor.
Figure 12B:
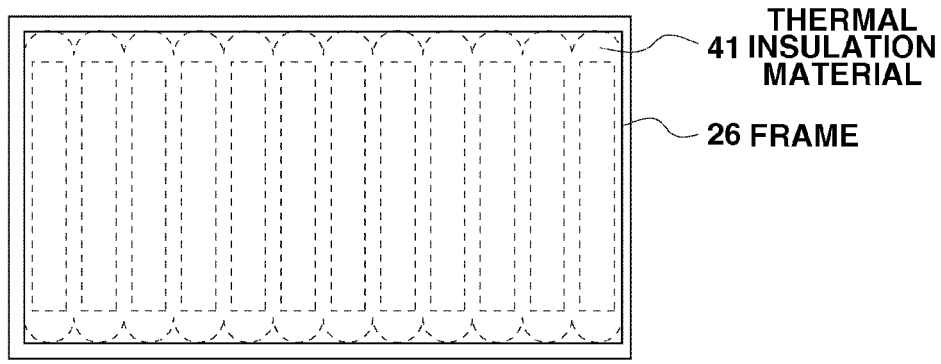

In FIG. 10, a leakage heat amount suppressing unit as in the first exemplary embodiment is included in a so-called planar type linear motor.

In FIG. 10, a coil group of a first layer in which coils 303 with a substantially elliptical shape are arrayed in an X direction, a coil group of a second layer in which the coils 303 are arrayed in a Y direction, a magnet group 301 disposed to face the coil, and a movable top plate 302, which holds a magnet and has a freedom degree in three translational axes and three rotational axes, are included.

The substantially elliptical shape represents a shape that has a longitudinal direction in the X or Y direction in FIG. 10. For example, it represents a shape in which both ends of two straight lines are coupled by curved lines. The coil 303 may have a substantially rectangular shape. Here, the substantially elliptical shape and the substantially rectangular shape are represented as "elongated".

A first cooling unit 305 having a coolant flow passage for cooling the coil 303 is disposed at a side opposite to the magnet group 301 and also serves as a coil support for supporting the coil. A coolant flows to the first cooing unit 305 through a coupling 309 to cool the coil 303.

An appropriate electric current is applied to an appropriate coil by the a current driver (not illustrated), and driving force is generated between the coil 303 group and the magnet group 301 to drive the movable top plate 302 in three translational-axis and three rotational-axis directions. A measurement system using a laser interferometer and a control system (not illustrated) are disposed to control a position of the movable top plate 302.

A thermal insulation material 306 is disposed on a surface of the coil 303 on a magnet 301 side, a thermal conduction member 307 is disposed between the thermal insulation material 306 and the magnet 301. The thermal conduction member 307 is cooled by a cooling member 308, which cools the thermal conduction member 307 even in the outside of an operating range of the magnet 301.

This configuration can suppress the heat amount leaked from the coil 303 group to the ambient space. Since the heat amount leaked to the ambient space can be suppressed, it is possible to suppress thermal deformation of a structure such as the movable top plate 302 present in the ambient space or a measurement error by a so-called temperature variation of the laser interferometer which is not illustrated.

Since the thickness can be reduced compared to the conventional configuration with only the thermal insulation material, expansion of a magnetic gap between the coil 303 group and the magnet group 301 can be reduced, the efficiency of the linear motor can be improved compared to that of the conventional art.

Incidentally, thermal insulation materials 312 are disposed at left and right sides of the coil 303 group. Therefore, the heat amount leaked to the ambient space from the left and right sides of the coil 303 group is suppressed. Since the left and right side direction of the coil 303 group is not related to the efficiency of the linear motor, the thermal insulation material 312 with a sufficient thickness which is allowed by the space can be disposed, thereby suppressing the leakage heat amount.

Figure 13:
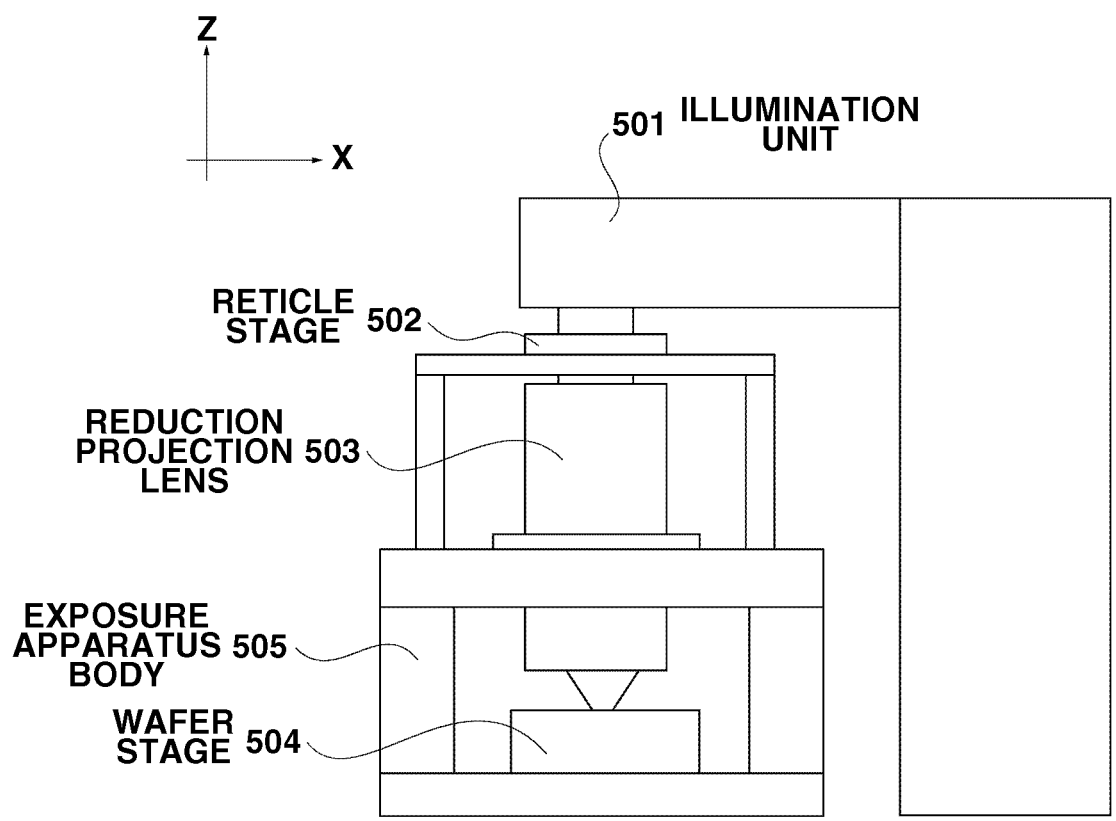
FIG. 13 illustrates an example of an exposure apparatus of the present invention.

An exemplary exposure apparatus to which the linear motor according to the exemplary embodiments of the present invention is applied will be described below. An exposure apparatus body 505 includes a illumination unit 501, a reticle stage 502 on which a reticle (an original plate) is placed, a projection optical system 503, and a wafer stage 504 on which a wafer (a substrate) is placed as illustrated in FIG. 13.

The exposure apparatus is used to project a circuit pattern formed on a reticle on a wafer to exposed the wafer thereto and may use a step and repeat projection exposure technique or a step and scan projection exposure technique. The linear motor of the present invention may be used in any of the reticle stage 502 and the wafer stage 504.

The illumination unit 501 illuminates the reticle in which the circuit pattern is formed and includes alight source unit and an illumination optical system. As the light source, for example, a laser may be used. As the laser, an ArF excimer laser with a wavelength of about 193 nm, a KrF excimer laser with a wavelength of about 248 nm, or a F2 excimer laser with a wavelength of about 157 nm may be used. However, a kind of the laser is not limited to the excimer laser, and, for example, an yttrium-aluminum-garnet (YAG) laser may be used. Further, the number of lasers is not limited.

When a laser is used as the light source, a luminous flux shaping optical system for shaping a parallel luminous flux from a laser source into a desired beam shape or an incoherent conversion optical system for converting a coherent laser flux into an incoherent laser flux may be used. The light source used in the light source unit is not limited to the laser, and one or more mercury lamps or xenon lamps may be used.

The illumination optical system is an optical system for illuminating a mask and includes a lens, a mirror, a light integrator, and a diaphragm. As the projection optical system 503, an optical system including only a plurality of lens elements or an optical system (a catadioptric optical system) having a plurality of lens elements and at least one concave mirror may be used. Also, an optical system having a plurality of lens elements and at least one diffraction optical element such as a kinoform or an optical system of a full mirror type may be used.

The reticle stage 502 and the wafer stage 504 are movable by, for example, the linear motor. In the case of the step and scan projection exposure technique, respective stages are moved in synchronization. A separate actuator is disposed on at least one of the wafer stage and the reticle stage, to position a pattern of the reticle on the wafer.

The exposure apparatus may be used for manufacturing a device in which a fine pattern is formed such as a semiconductor device such as a semiconductor integrated circuit, a micro machine, and a thin film magnetic head.

A device (for example, a semiconductor integrated circuit and a liquid crystal display device) is manufactured by a process of exposing to light a substrate (for example, a wafer or a glass substrate) coated with a photosensitizing agent through the exposure apparatus according to the exemplary embodiment described above, a process of developing the substrate, and other well-known processes.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-089180 filed Apr. 1, 2009, which is hereby incorporated by reference herein in its entirety.

What is claimed is:

1. A linear motor, comprising:
   a first member including a magnet; and
   a second member including a coil facing toward the magnet and configured to move relative to the first member,
   wherein the second member includes a thermal conduction member, a thermal insulation member, the coil, and a first cooling unit for cooling the coil, which are disposed in this order from the magnet, and a second cooling unit, which cools the thermal conduction member, that is disposed outside an area in which the magnet and the coil face toward each other.

2. The linear motor according to claim 1, wherein the thermal conduction member is disposed in an area in which the magnet and the coil face toward each other.

3. The linear motor according to claim 1, further comprising:
   a third cooling unit disposed on an opposite side of the first cooling unit with respect to the coil and configured to cool the coil.

4. The linear motor according to claim 1, wherein the second cooling unit is in contact with the coil to cool the coil.

5. The linear motor according to claim 1, wherein the first member is a mover, the second member comprises a stator having the insulation member, the coil, and the first cooling unit, the coil is a square cylindrical annular coil, the first cooling unit is disposed in a space inside the coil to support the coil, and the thermal insulation member and the thermal conduction member are disposed in an area in which the magnet and a plane portion of the coil face toward each other.

6. The linear motor according to claim 1, wherein the first member is a mover, the second member comprises a stator having the insulation member, the coil, and the first cooling unit, is an elongated coil, the first cooling unit supports the coil, and the thermal insulation member and the thermal conduction member are disposed in an area in which the magnet and the coil face toward each other.

7. The linear motor according to claim 1, wherein the second cooling unit has a flow passage in which a coolant flows, and the coolant is lower in temperature than an ambient space.

8. The linear motor according to claim 1,
   wherein the first cooling unit and the second cooling unit includes a flow passage in which a coolant flows, and a temperature adjustor configured to adjust a temperature of the coolant, and
   wherein the coolant flows in an order of the temperature adjustor, the flow passage of the second cooling unit, and the flow passage of the first cooling unit.

9. The linear motor according to claim 8, wherein the temperature adjustor adjusts the temperature of the coolant based on a driving state of the linear motor.

10. The linear motor according to claim 9, further comprising
a measurement unit configured to measure the driving state of the linear motor, and
a computing unit configured to compute a temperature of the coolant based on a measurement result of the measurement unit.

11. The linear motor according to claim 1 further comprising a current driver configured to apply an electric current to the coil.

12. A stage apparatus, comprising:
a top plate; and
a linear motor configured to move the top plate,
wherein the linear motor includes:
a first member including a magnet;
a second member including a coil facing toward the magnet, a thermal conduction member, a thermal insulation member, and a first cooling unit for cooling the coil, and in which the thermal conduction member, the thermal insulation member, the coil, and the first cooling unit for cooling the coil are disposed in this order from the magnet;
a second cooling unit, which cools the thermal conduction member, disposed outside an area where the magnet and the coil face toward each other.

13. The stage apparatus according to claim 12, wherein the linear motor further includes a current driver configured to apply an electric current to the coil.

14. The stage apparatus according to claim 12, wherein the linear motor further includes a third cooling unit disposed on an opposite side of the first cooling unit with respect to the coil and configured to cool the coil.

15. The stage apparatus according to claim 12, wherein the first member is a mover, the second member comprises a stator having the insulation member, the coil, and the first cooling unit, the coil is one of a square cylindrical annular coil and an elongated coil, the first cooling unit is disposed in a space inside the coil to support the coil, and the thermal insulation member and the thermal conduction member are disposed in an area in which the magnet and a plane portion of the coil face toward each other.

16. An exposure apparatus comprising:
a projection optical system configured to project a pattern of an original plate on a substrate; and
a stage apparatus configured to hold at least one of the substrate and the original plate,
wherein the stage apparatus includes:
a top plate; and
a linear motor configured to move the top plate,
wherein the linear motor includes:
a first member including a magnet;
a second member including a coil facing toward the magnet, a thermal conduction member, a thermal insulation member, and a first cooling unit for cooling the coil, and in which the thermal conduction member, the thermal insulation member, the coil, and the first cooling unit for cooling the coil are disposed in this order from the magnet;
a second cooling unit configured to cool the thermal conduction member, which is disposed outside an area where the magnet and the coil face toward each other.

17. The exposure apparatus according to claim 16, wherein the linear motor further includes a current driver configured to apply an electric current to the coil.

18. A method for manufacturing a device, comprising:
projecting a pattern of an original plate on a substrate by using an exposure apparatus to expose the substrate to the projected pattern; and
developing the exposed substrate,
wherein the exposure apparatus includes:
a projection optical system configured to project the pattern of the original plate on the substrate; and
a stage apparatus configured to hold at least one of the substrate and the original plate,
wherein the stage apparatus includes:
a top plate; and
a linear motor configured to move the top plate,
wherein the linear motor includes:
a first member including a magnet;
a second member including a coil facing toward the magnet, a thermal conduction member, a thermal insulation member, and a first cooling unit for cooling the coil, and in which the thermal conduction member, the thermal insulation member, the coil, and the first cooling unit for cooling the coil are disposed in this order from the magnet;
a second cooling unit configured to cool the thermal conduction member, and disposed outside an area where the magnet and the coil face toward each other.

19. The method according to claim 18, wherein the linear motor further includes a current driver configured to apply an electric current to the coil.

20. The method according to claim 18, wherein the linear motor further includes a third cooling unit disposed on an opposite side of the first cooling unit with respect to the coil and configured to cool the coil.

* * * * *